United States Patent
Sakaue et al.

(10) Patent No.: US 8,856,613 B2
(45) Date of Patent: Oct. 7, 2014

(54) SEMICONDUCTOR STORAGE DEVICE, MEMORY CONTROL DEVICE, AND CONTROL METHOD OF SEMICONDUCTOR MEMORY

(75) Inventors: Kenji Sakaue, Kanagawa (JP); Yoshio Mochizuki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 472 days.

(21) Appl. No.: 13/051,645

(22) Filed: Mar. 18, 2011

(65) Prior Publication Data

US 2012/0072803 A1    Mar. 22, 2012

(30) Foreign Application Priority Data

Sep. 22, 2010 (JP) ................................. 2010-212173

(51) Int. Cl.
  *G11C 29/00*     (2006.01)
  *G06F 11/10*     (2006.01)
  *H03M 13/15*     (2006.01)
(52) U.S. Cl.
  CPC ....... *G06F 11/1048* (2013.01); *H03M 13/1515* (2013.01)
  USPC .......................................... 714/763; 714/773
(58) Field of Classification Search
  CPC ........ G11C 19/285; H04L 49/30; G06F 13/10
  USPC ................................................ 714/763, 773
  See application file for complete search history.

(56) References Cited

U.S. PATENT DOCUMENTS

| | | | | |
|---|---|---|---|---|
| 5,682,346 A | * | 10/1997 | Yamamura et al. | 365/185.18 |
| 7,231,585 B2 | | 6/2007 | Vainsencher et al. | |
| 7,574,648 B2 | * | 8/2009 | Akiyama et al. | 714/769 |
| 2004/0186952 A1 | * | 9/2004 | Hagiwara et al. | 711/112 |
| 2007/0113209 A1 | * | 5/2007 | Park et al. | 716/4 |
| 2009/0052238 A1 | * | 2/2009 | Shinagawa et al. | 365/185.01 |
| 2009/0125787 A1 | * | 5/2009 | Sakimura et al. | 714/764 |
| 2009/0141544 A1 | * | 6/2009 | Sakimura et al. | 365/158 |
| 2010/0232244 A1 | | 9/2010 | Hirabayashi | |

FOREIGN PATENT DOCUMENTS

| | | |
|---|---|---|
| JP | 11-259373 | 9/1999 |
| JP | 2000-173289 | 6/2000 |
| JP | 4071789 | 1/2008 |
| JP | 2009-259113 | 11/2009 |

* cited by examiner

*Primary Examiner* — M. Mujtaba K Chaudry
(74) *Attorney, Agent, or Firm* — Oblon, Spivak, McClelland, Maier & Neustadt, L.L.P.

(57) ABSTRACT

According to one embodiment, a semiconductor storage device includes a semiconductor memory which includes two or more cell peripheral circuits and two or more storage cells at least one of reading and writing of which is controlled by the cell peripheral circuits in each of the cell peripheral circuits. Further, the semiconductor storage device includes a memory control unit configured to instruct to form 1 symbol as a unit for creating an error correction code by the data held by the storage cells controlled by the same cell peripheral circuit and creating an error correction code to the symbol created base of the instruction.

18 Claims, 4 Drawing Sheets

SEMICONDUCTOR STORAGE DEVICE, MEMORY CONTROL DEVICE, AND CONTROL METHOD OF SEMICONDUCTOR MEMORY

CROSS-REFERENCE TO RELATED APPLICATIONS

This application is based upon and claims the benefit of priority from the prior Japanese Patent Application No. 2010-212173, filed on Sep. 22, 2010; the entire contents of which are incorporated herein by reference.

FIELD

Embodiments described herein relate to generally a semiconductor storage device, a memory control device, and a control method of a semiconductor memory.

BACKGROUND

In a semiconductor storage device for storing information using a non-volatile semiconductor memory, there is a possibility that an error occurs in data due to aged deterioration and the like. The semiconductor storage device executes an error correction coding process even when a data error occurs so that the error can be corrected.

DETAILED DESCRIPTION

Figure 1:
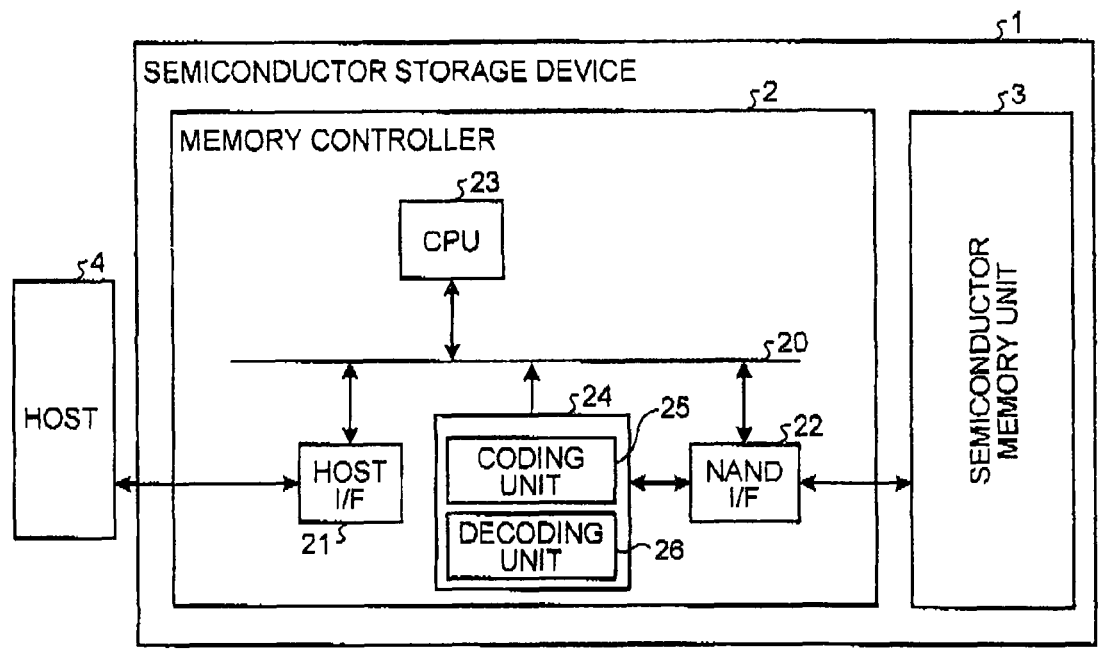
FIG. 1 is a diagram of a configuration example of a semiconductor storage device according to a first embodiment.

In general, according to one embodiment, a semiconductor storage device includes a semiconductor memory which includes two or more cell peripheral circuits and two or more storage cells at least one of reading and writing of which is controlled by the cell peripheral circuits in each of the cell peripheral circuits. Further, the semiconductor storage device includes a control section configured to instruct to form 1 symbol as a unit for creating an error correction code by the data held by the storage cells controlled by the same cell peripheral circuit and a coding unit configured to create an error correction code to the symbol created base of the instruction of the control section.

Although there are various types of error correction codes, to cope with a bit error (burst error) which occurs continuously, a Reed-Solomon (RS) codes are often used. The RS codes have a high error correction capability and, in particular, have characteristics that they are strong to the burst error.

When a NAND type memory is used as a non-volatile semiconductor memory, although several data error modes, in which the burst error occurs, exist, one of the data error modes is a data error mode due to aged deterioration and the like of a peripheral circuit for reading a storage cell (hereinafter, called a peripheral circuit).

In a NAND type memory, storage cells are connected in series to the same bit line. The storage cells are disposed in a matrix state by disposing plural bit lines, to the storage cells are connected, in a direction (row direction) orthogonal to a direction (column direction) in which the bit lines extend. The storage cells are connected in the row direction by word lines.

Further, in the NAND type memory, to increase a degree of integration, N pieces (N is, for example, 8) of bit lines are configured as a group called a column, and a set of peripheral circuits is installed to each column. Accordingly, when the peripheral circuits do not normally function due to the aged deterioration and the like, there is a possibility that plural data in the same column cannot be read.

When N is 8 and a column address is allocated to each 1 byte of the NAND type memory, the column address is allocated to each eight bits disposed in the row direction in the same column. The column addresses are allocated to the data (1 byte) of the same row connected by a word line in a fashion of, for example, 0, 1, 2, ..., and a column address is allocated to a first data of 1 byte of a next row (next page). For example, when the bit lines are configured of 32 columns, addresses from 0 to 31 are allocated to the data of 1 byte of the respective rows (respective pages).

In a conventional semiconductor device using a NAND type memory, when RS coding is executed using 2 bytes as 1 symbol, the coding is executed using two data, in which addresses continue in the same page, as 1 symbol. Accordingly, when the column error occurs, errors occur dispersedly in many symbols configured of the data of the column. Accordingly, to cope with the errors when the column error occurs, the number of symbols which can be corrected is set to a large value in RS coding. Therefore a coding rate is lowered.

The semiconductor storage device, the memory control device, and the control method of the semiconductor memory according to the embodiment will be explained below in detail referring to the attached drawings. Note that the invention is not limited to the following embodiments.

(First Embodiment)

FIG. 1 is a diagram a configuration example of a semiconductor storage device according to a first embodiment. A semiconductor storage device 1 of the embodiment is composed of a memory controller (memory control device) 2 and a semiconductor memory unit 3 including a NAND type storage cell. The semiconductor storage device 1 is connected to a host 4 via a communication medium and functions as an external storage medium to the host 4. A personal computer, a central processing unit (CPU) core, and the like are exemplified as an example of the host 4.

The memory controller 2 is composed of an internal bus 20, a Host I/F (interface) 21, a NAND I/F (interface) 22, a CPU unit (abbreviated as CPU in FIG. 1) 23, and an error correction processing section 24. The error correction processing section 24 is composed of a coding unit 25 and a decoding unit 26.

The Host I/F 21 outputs the command, the data, and the like received from the host 4 to the internal bus 20. Further, the Host I/F 21 transmits the data input via the internal bus 20, the response notification (notification illustrating that a command has been executed, and the like) from the CPU unit 23 to the host 4.

The CPU unit 23 is a control unit for integrally controlling the respective components of the semiconductor storage device 1 and is composed of a CPU core, a random access memory (RAM), a read only memory (ROM), a direct memory access (DMA) controller, and the like. When the CPU unit 23 receives a command from the host 4 via the Host I/F 21 and the internal bus 20, the CPU unit 23 executes a control in response to the command. For example, the CPU unit 23 instructs the NAND I/F 22 to write data to the semiconductor memory unit 3, to read data from the semiconductor memory unit 3, and the like in response to the command from the host 4. Further, the CPU unit 23 instructs the error correction processing section 24 to execute an error correction coding process or a decoding process.

The error correction processing section 24 executes the error correction coding process to the data received from the host 4 and outputs the processed data to the NAND I/F 22 and executes a decoding process to the data input from the NAND I/F 22 based on the instruction from the CPU unit 23. The NAND I/F 22 executes reading, writing, and the like of the semiconductor memory unit 3 based on the instruction of the CPU unit 23.

Note that the configuration of the semiconductor storage device 1 illustrated in FIG. 1 is an example, and any configuration, which has a semiconductor memory and a controller for controlling the reading/writing of the semiconductor memory and can communicates with the host 4, may be employed in addition to the configuration illustrated in FIG. 1.

Figure 2:
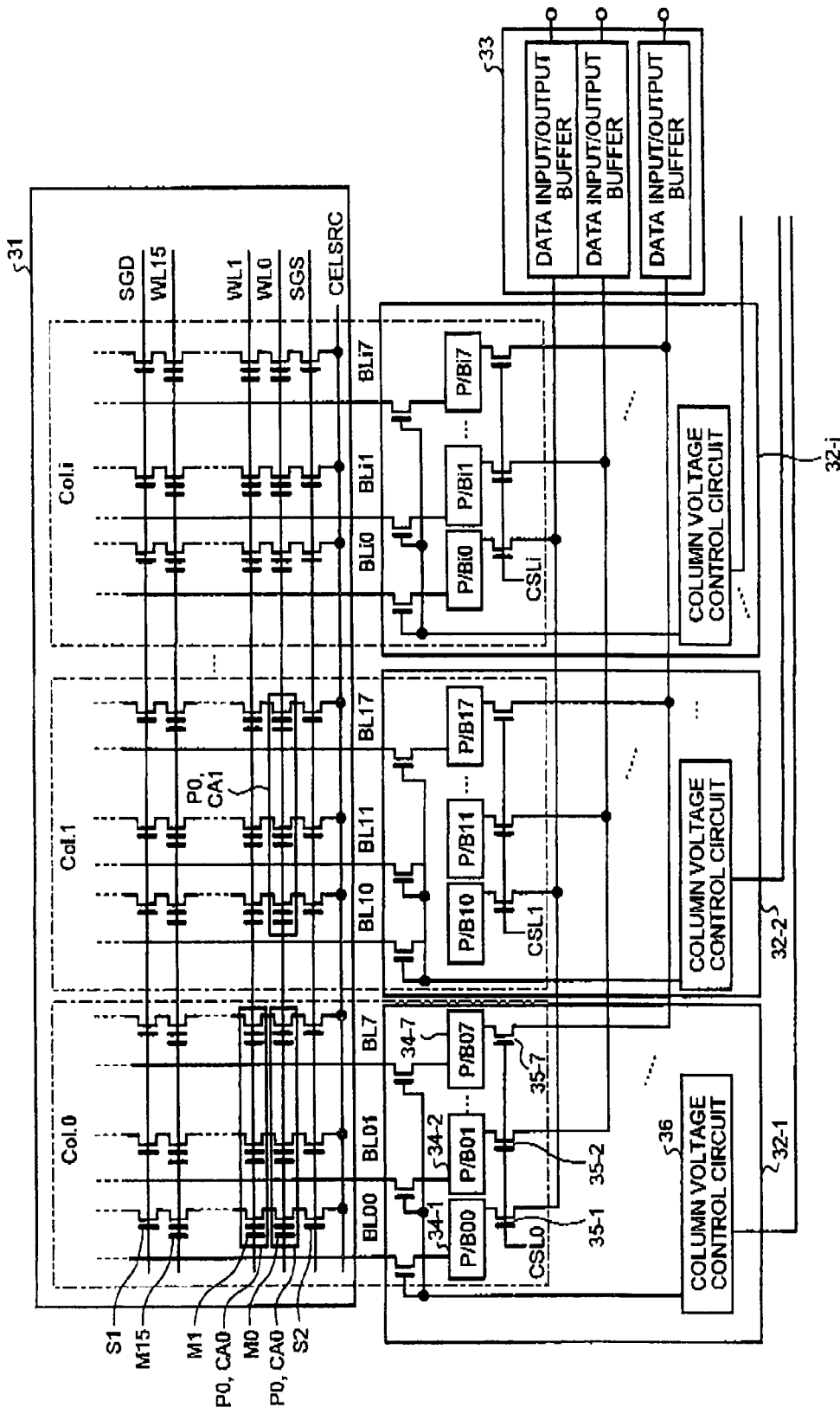
FIG. 2 is a diagram of a configuration example of a semiconductor memory unit according to the first embodiment.

FIG. 2 is a diagram a configuration example of the semiconductor memory unit 3 of the embodiment. As illustrated in FIG. 2, the semiconductor memory unit 3 of the embodiment is composed of a storage cell section 31, which is composed of plural single-level cells (SLCs), column circuits (cell peripheral circuits) 32-1 to 32-i (i is an integer of 1 or more), and a buffer section 33. The column circuits 32-1 to 32-i are peripheral circuits for controlling the reading/writing of the storage cell section 31. The column circuits 32-1 to 32-i are composed of page buffer circuits 34-1 to 34-7 each composed of a sense amplifier circuit acting also as a latch circuit, column gate circuits 35-1 to 35-7, and a column voltage control circuit 36. Note that, in FIG. 2, as the page buffer circuits 34-1 to 34-7, a page buffer circuit (P/B) corresponding to a bit k of a column j is illustrated as P/B (j−1) k. The page buffer circuits 34-1 to 34-7 hold read data or write data, and when data is read, the page buffer circuits 34-1 to 34-7 amplify the read data of a bit line. The column gate circuits 35-1 to 35-7 are gate circuits for selecting a bit to be read or written based on a column selection signal CSLj. The column voltage control circuit 36 creates a signal for connecting and controlling the bit lines to a data buffer.

The storage cell section 31 includes a common source line CELSRC and electrically rewritable non-volatile storage cells M0 to M15 connected in series, and both the ends of the storage cells M0-M15 are connected to a bit line BLjk (a k-th bit line of a j-th column) and to the common source line CELSRC, respectively via a selection cell S1 and a selection cell S2.

The storage cell section 31 is divided to i pieces of groups (columns) each composed eight bit lines, and the groups are called Col.0, Col.1, . . . , Col.i. One bit line is connected with blocks each having 16 storage cells (M0-M15) as a set sandwiched between the selection cell S1 and the selection S2. A column circuit 32-j (j=1, 2, . . . , i) is connected to a Col. (j−1). Further, word lines (WL0-WL15) are connected to the bit lines in a direction orthogonal to the bit lines, and data is read in each word line. Note that although it is assumed here that the 16 storage cells are sandwiched between the selection cell S1 and the selection cell S2, the number of the storage cells is not limited to 16 and any number of storage cells may be sandwiched therebetween.

In the following explanation, although it is assumed that i is 32 and eight storages cells are sandwiched between the selection cell S1 and the selection S2, the numbers are only examples and the numbers of i and the storages cells are not limited to the numbers.

Next, a write operation to the semiconductor memory unit 3 of the embodiment and a read operation from the semiconductor memory unit 3 will be explained. Writing and reading to and from the semiconductor memory unit 3 are executed in a page unit (in a word line unit). Note that, although it is assumed here k=8, k is not limited to 8. Further, since i is 32 here, one page is set to 32 bytes. Note that the data amount of the one page is an example, and the data amount of the one page is not restricted.

First, when the CPU unit 23 is instructed to write data from the host 4, the CPU unit 23 instructs the error correction processing section 24 to execute coding as well as and instructs the NAND I/F 22 writing to the semiconductor memory unit 3. The data of a target to be written, which is transmitted from the host 4, is written to a not illustrated buffer memory in the semiconductor storage device 1. The coding unit 25 of the error correction processing section 24 creates an error correction code to the data input from the buffer memory and outputs the error correction code to the NAND I/F 22. The NAND I/F 22 writes the data input from the buffer memory and the error correction code created by the coding unit 25 to the semiconductor memory unit 3.

Further, the CPU unit 23 is instructed to read data from the host 4, the CPU unit 23 instructs the error correction processing section 24 to execute decoding as well as instructs the NAND I/F 22 reading from the semiconductor memory unit 3. The NAND I/F 22 reads data and the error correction code corresponding to the data from the semiconductor memory unit 3 based on the instruction from the CPU unit 23, outputs the read error correction code to the error correction processing section 24, and writes the read data to the buffer memory. The decoding unit 26 of the error correction processing section 24 executes a decoding process based on the error correction code, and when it is determined that an error is caused by the decoding process, the decoding unit 26 corrects the data written to the buffer memory based on the error correction code. The Host I/F 21 transmits the data written to the buffer memory to the host 4.

Next, a creation process of the error correction code of the embodiment will be explained. Here, a case in which the RS code is created as the error correction code will be explained. Note that, although the case in which the RS code is used will be explained here, any error correction code may be used in addition to the RS code as long as the error correction code creates the error correction code in a symbol unit.

It is assumed here that the column address (logic address) is allocated to each 1 byte (eight bits) disposed in the row direction (the direction of the word line) in the same column. Since the reading and the writing are executed in each word line, continuous column addresses are allocated to the data (1 byte) of the same row connected by the word line. As illustrated in, for example, FIG. 2, a column address CA0 is allocated to 1 byte including a storage cell M0 in the column Col.1 of a page P0 connecting to a word line WL0, and a column address CA1 is allocated to 1 byte including the storage cell M0 in the column Col.1 of the page P0 connecting to the word line WL0. Further, the column address CA0 is allocated to 1 byte including a storage cell M1 in the column Col.0 of a page P1 connecting to a word line WL1.

Figure 3:
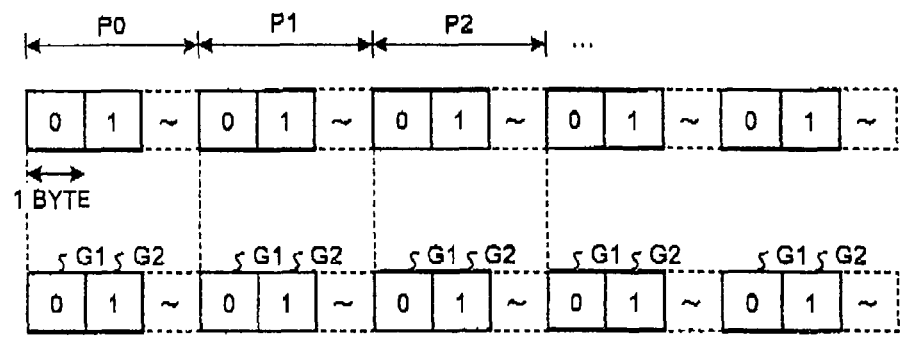
FIG. 3 is a diagram of the relation between a column address and a column circuit.

FIG. 3 is a diagram the relation between column addresses and column circuits. In FIG. 3, the column addresses CA0, CA1, . . . of respective pages (page P0 to page P15) in a block are set to 0, 1, . . . , a column address corresponding to a storage cell controlled by a column circuit 32-1 (column address in the column Col.0) is illustrated by G1, and a column address corresponding to a storage cell controlled by a column circuit 32-2 (column address in the column Col.1) is illustrated by G2. As described above, the storage cells corresponding to adjacent column addresses are controlled by column circuits different from each other.

In a conventional semiconductor storage device, when the RS code of the data to be written to the semiconductor memory unit 3 having the structure, a symbol is configured by the data corresponding to continuous column addresses. When, for example, 1 symbol is configured of 2 bytes, 1 symbol is formed of the data corresponding to the column addresses CA0, CA1 in the same page, and 1 symbol is formed of column addresses CA2 and CA3. When, for example, the column addresses of data, which configure 1 symbol in the page P1 is illustrated in { }, 16 symbols of {CA1, CA0}, {CA3, CA2}, . . . {CA31, CA30} are created. As described above, 16 symbols are formed in each page.

In the conventional semiconductor storage device, when for example, the column circuit 32-1 stops its function, all the storage cells in the column Col.0 controlled by the column circuit 32-1 becomes read impossible. When the error of the column unit (column error) occurs, in the conventional RS coding, an error occurs in a symbol which includes even a column address corresponding to the column Col.0 as in {CA1, CA0} of the page P0, {CA1, CA0} of the page P1, and the like. When, for example, the column circuit 32-1 stops its function, the error occurs in 16 symbols per 1 block (as illustrated in FIG. 2, it is assumed that the 1 block is composed of 16 word lines). Accordingly, to permit an error correction even when the column error occurs, when the error correction process is executed in each block, it is necessary to set the number of symbols t (error correction capability) which can be corrected per 1 block to 16 or more.

Figure 4:
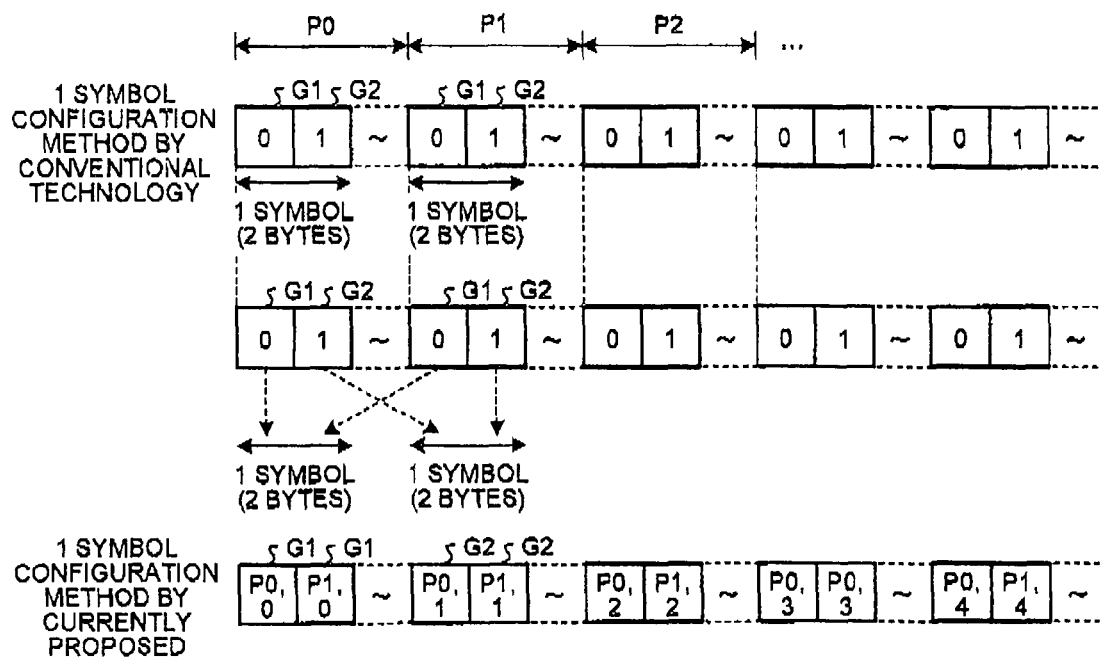
FIG. 4 is a diagram of an example of a symbol configuration according to the first embodiment.

In contrast, in the embodiment, 1 symbol is configured of the data corresponding to the column addresses subordinating to the same column. FIG. 4 is a diagram an example of the configuration of the symbol of the embodiment. In the embodiment, as illustrated in FIG. 4, 1 symbol is configured of the 2-byte data configured of the 2 column addresses belonging to the same column in such a manner that 1 symbol is formed of the data of the address of CA0 (P0, 0) of the page P0 subordinating to Col.0 (G1) and the data of CA0 (P1, 0) of the page P1, and the like.

It is supposed, for example, that a Galois extension field executes coding by GF ($2^{16}$). Since the number of symbols per 1 block, which subordinates to the same column, is 16/2=8, when the column error occurs in one column, eight symbols are influenced by the column error. Therefore, to permit the error correction when one column error occurs, it is sufficient to execute the RS coding setting the number of symbols t, which can be corrected per 1 block, to eight or more. As described above, the error correction can be efficiently executed to the column error by configuring 1 symbol of the 2-byte data corresponding to the 2 column addresses subordinating to the same column.

For example, as illustrated in FIG. 4, eight symbols, which correspond to eight pairs of column addresses of {CA0 of P0, CA0 of P1}, {CA96 of P3, CA64 of P2}, . . . {CA0 of P15, CA0 of P14}, subordinating to the column Col.0 in 1 block.

When the column circuit 32-1 stops its function, all the symbols of the column Col.0 controlled by the column circuit 32-1, that is, the eight symbols described above are erroneously read per block. However, since the error of eight or more symbols can be corrected, all the symbols of the column Col.0 can be corrected.

The column address allocation method described above is an example, and the configuration of the column and the allocation method of the column address are different subordinating to a device used as the semiconductor memory unit 3. The symbol configuration method of the embodiment can be applied even if any allocation method is employed, and it is sufficient to configure 1 symbol of the data of the column addresses subordinating to the same column (unit used in the same peripheral circuit).

In the embodiment, it is assumed that the CPU unit 23 previously finds the allocation method of the device information for executing a control to configure 1 symbol of the data of the column addresses subordinating to the same column, that is, the column configuration and the column addresses of the device used as the semiconductor memory unit 3. The CPU unit 23 instructs an order of column addresses of a target to be coded to the coding unit 25 based on the column configuration and the column addresses of the device so that 1 symbol is configured of the data of the column addresses subordinating to the same column.

Note that the CPU unit 23 may obtain the allocation method of the column configuration and the column addresses of the device of a target to be controlled (used as the semiconductor memory unit 3) in an initialization routine. Further, the memory controller 2 may previously hold the correspondence between the identification information of the types of devices and the allocation method of the column configuration and the column addresses as address information as to plural devices, and the CPU unit 23 may obtain the identification information of the types of the devices from a device to be controlled in the initialization routine and may find the allocation method of the column configuration and the column addresses based on the obtained identification information and the held address information.

Note that, in the embodiment, the sets of the column addresses which configure 1 symbol are determined in an order of smaller page addresses such as {CA0 of P1, CA0 of P0}, {CA0 of P3, CA0 of P2}. . . . However, the sets of the column addresses are not limited to the order and may be determined in any order of, for example, {CA0 of P3, CA0 of P0}, {CA0 of P4, CA0 of P1}, . . . , and the like, and any combination may be employed as long as 1 symbol is configured of the column addresses in the same column.

Further, in the embodiment, 1 symbol is configured of 2 bytes, that is, 1 symbol is configured of the data corresponding to 2 column addresses. However, also when 1 symbol is configured of the data corresponding to three or more column addresses, it is sufficient to configure 1 symbol of the column addresses subordinating to the same column (the data corresponding to column addresses) likewise.

Further, the embodiment explains the case in which the error correction coding process is executed in the block unit. However, the embodiment is not limited thereto, and the error correction coding process may be executed in any process unit, and it is sufficient to configure a symbol so that 1 symbol is configured of the data of the column addresses subordinating to the same column in each process unit.

Note that, in the embodiment, a storage cell such as one column (column Col.0 and the like) is connected to one column circuit. However, the embodiment is not limited thereto, and one of the column circuits 32-1 to 32-i may control plural columns such as, for example, the column circuit 32-1 controls the columns Col.0, Col.32, Col.64, . . . , and the like. Also in the case, it is sufficient to configure 1 symbol of a target, which is subjected to the error correction coding, of the data of the column addresses subordinating to the same column.

Figure 5:
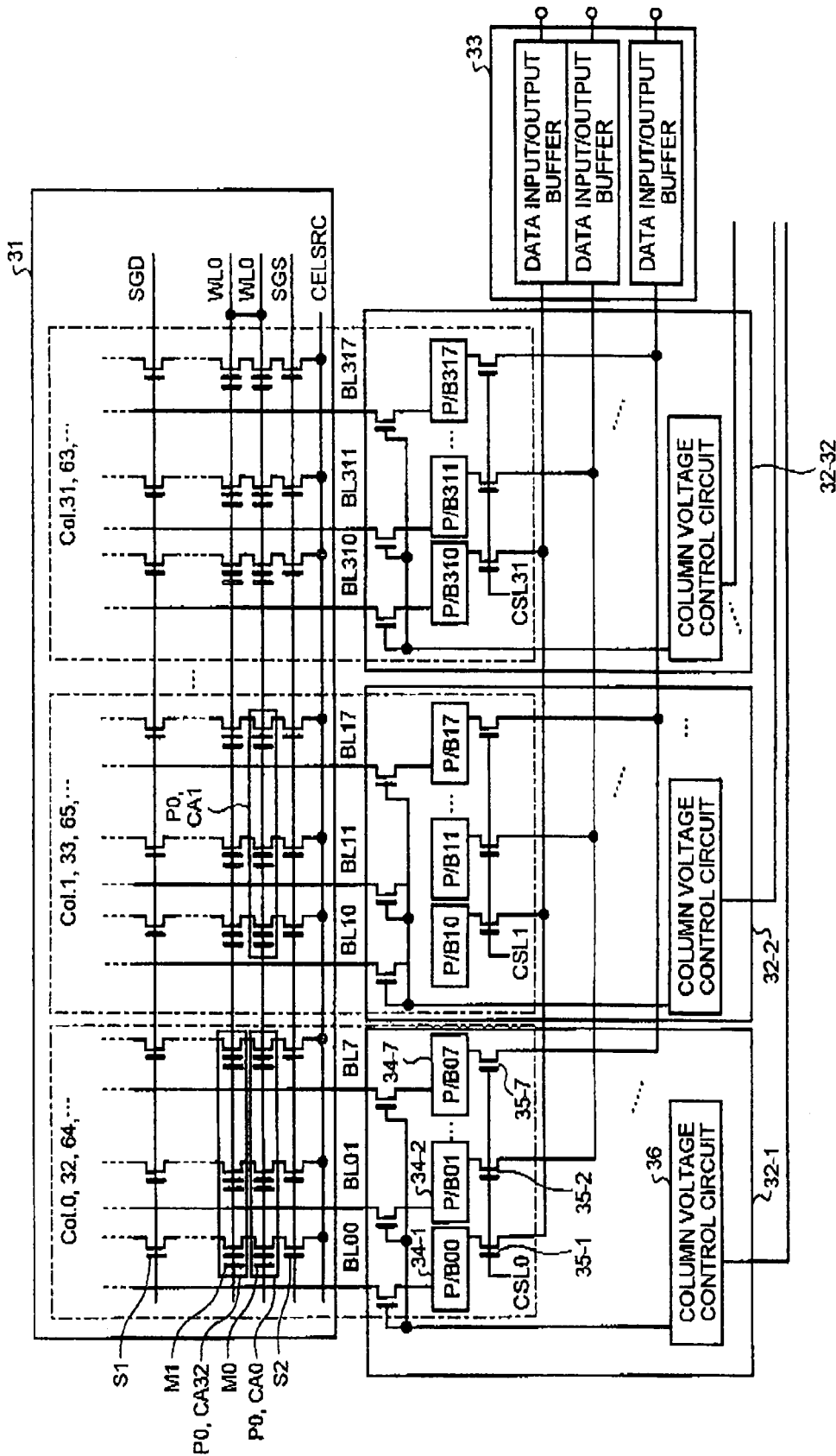
FIG. 5 is a diagram of a configuration example of a semiconductor storage device when two or more column storage cells are connected to one column circuit.

FIG. 5 is a diagram a configuration example of a semiconductor storage device when the storage cells of two or more columns are connected to one column circuit. Although FIG. 5 illustrates an example provided with 32 column circuits, the number of the column circuits may be not limited thereto. The configuration example of FIG. 5 is the same as the configuration example of FIG. 1 except that the storage cell section 31 is differently configured. The point, in which the configuration example of FIG. 5 is different from the configuration example of FIG. 1, will be explained.

In the configuration example of FIG. 5, a storage cell M1, which is disposed on a storage cell M0 belonging to the column Col.0 of a lowermost row, belongs to the column Col.32. Likewise, a storage cell, which is disposed on a storage cell belonging to the column Col.1 of the lowermost row, belongs to a column Col.33 ..., and a storage cell, which is disposed on a storage cell belonging to a column Col.31 of the lowermost row, belongs to a column Col.63. The word lines, which connect the storage cells of the lowermost row belonging to the columns Col.0 to Co.31 are connected to each other in such a manner that the word lines, which connect the storage cells of the lowest row belonging to the columns Col.0 to Co.63 are connected to the word lines which connect the storage cells belonging to the columns Col.32 to Co.63, . . . so that the word lines function as one word line (WL0) in their entirety. The storage cell section 31 includes one or more sets of the word lines which are connected to each other and function as one word line.

In the configuration example of FIG. 5, the storage cell M1 disposed on the storage cell M0 belongs to the Col. 32 and a column address thereof is CA32 on the page P0. Accordingly, when, for example, the error correction code is created in the page unit and 1 symbol is formed of 2 bytes, 1 symbol is formed of the data of the column addresses controlled by the column circuit 32-1 such as {CA0, CA32}, {CA96, CA64} . . . of the respective pages. Likewise, it is sufficient to configure 1 symbol of the data of the column addresses controlled by the same column circuit in such a manner that 1 symbol is created by the data of the column addresses controlled by the column circuit 32-2 as in {CA1, CA33}, {CA97, CA65} . . . Note that, also when an error correction code creation process is executed in a unit of plural pages, it is sufficient to configure 1 symbol of the data of the column addresses controlled by the same column circuit likewise.

Note that, in the embodiment, the column circuits 32-1 to 32-i control both the reading and the writing of the storage cells of corresponding columns. However, when the reading and the writing are realized by a different circuit, respectively, 1 symbol may be configured of the data of the column addresses which is controlled by the same circuit as to any one of a read circuit or a write circuit.

As described above, in the embodiment, when the error correction coding is executed, the 1 symbol of the target, which is subjected to the error correction coding, is configured of the data of column addresses subordinating to the same column. Accordingly, even if the column error is taken into consideration, the coding process can be executed efficiently and deterioration of the coding rate can be prevented.

(Second Embodiment)

Next, a semiconductor storage device 1 according to a second embodiment will be explained. The configuration of the semiconductor storage device 1 of the embodiment is the same as the semiconductor device 1 according to the first embodiment except that a semiconductor memory unit 3 is a multi-level cell (MCL: multi-value) NAND memory. The components having the same functions as those of the first embodiment are denoted by the same reference numerals as the first embodiment, and a duplicate explanation is omitted.

In the first embodiment, although the case that one-bit data is held in one storage cell, the multi-level cell NAND memory holds L-bit (L is an integer of two or more) data. The L bits held by one storage cell ordinarily are assigned different pages each other.

Also in the case, when one storage cell becomes defective, an error occurs in non-continuous symbols over plural pages corresponding to the L-bits of the storage cell. Further, likewise the first embodiment, when a column error occurs, an error occurs to a lot of non-continuous symbols over plural pages corresponding to the L-bits of the storage cells subordinating to the same column.

In the embodiment, the RS coding is executed in the plural pages in which the column addresses subordinating to the same column are contained, and also when the MCL cell is used, 1 symbol is configured of a combination of the data corresponding to the column addresses subordinating to the same column. In the case, 1 symbol may be formed of the data held by the same storage cell, or 1 symbol may be formed of the data held by a different storage cell. With the operation, even if the column error is taken into consideration, the coding can be executed efficiently likewise the first embodiment.

For example, it is assumed that a column is formed of eight bit lines, 32 columns are connected to 1 word line, and 1 block is configured of 16 word lines likewise the first embodiment. In the case, when it is assumed that L is 2, in a conventional RS coding method in which 1 symbol is configured of continuous column addresses, when a column error occurs, an error occurs to 16×2=32 symbols per block. In contrast, in the embodiment, when a column error occurs, an error occurs to 16 symbols per block. Accordingly, when the RS coding is executed so as to have a correction capability of 16 symbols or more per block, the column error can be coped with. The operation of the embodiment other than the operation described above is the same as the first embodiment.

As described above, in the embodiment, when the semiconductor memory unit 3 is the MCL NAND memory, the RS coding is executed by the plural pages in which the column addresses subordinating to the same column are included, and 1 symbol is configured of the combination of the data corresponding to the column addresses subordinating to the same column. Accordingly, since the coding process can be executed efficiently even when the column error is taken into consideration, deterioration of the coding rate can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a semiconductor memory configured to store write-data, the semiconductor memory including:
        a plurality of memory cells, the plurality of memory cells being divided into a plurality of cell groups; and
        a plurality of cell peripheral circuits, each of the plurality of cell peripheral circuits being configured to write the write-data to a cell group among the plurality of cell groups which corresponds to a respective one of the plurality of cell peripheral circuits; and a memory controller configured to control the semiconductor memory, the memory controller including:

a coding unit configured to encode a plurality of data symbols for generating a parity symbol, the plurality of data symbols being the write-data; and an interface configured to input the plurality of data symbols and the parity symbol to the semiconductor memory;

the semiconductor memory being configured to, using the plurality of cell peripheral circuits, write each of the plurality of data symbols to each of the plurality of cell groups.

2. The semiconductor storage device according to claim 1, wherein the plurality of data symbols are included in a page, the page being a data unit in which the write-data is read from the semiconductor memory, wherein a number of erroneous correctable data symbols in the page is equal to or greater than a number of data symbols in the page written to the cell group using the cell peripheral circuit that corresponds to the cell group among the plurality of cell peripheral circuits.

3. The semiconductor storage device according to claim 2, wherein the memory cells are configured as single bit memory cells.

4. The semiconductor storage device according to claim 1, wherein the plurality of data symbols are included in a plurality of pages, the page being a data unit in which the write-data is read from the semiconductor memory, wherein a number of erroneous correctable data symbols in the plurality of pages is equal to or greater than a number of data symbols in the plurality of pages written to the cell group using the cell peripheral circuit that corresponds to the cell group among the plurality of cell peripheral circuits.

5. The semiconductor storage device according to claim 3, wherein the memory cells are configured as multi-value memory cells.

6. The semiconductor storage device according to claim 1, wherein the coding unit encodes the plurality of data symbols for generating a parity symbol by a Reed-Solomon coding.

7. A memory controller configured to control a semiconductor memory, the semiconductor memory being configured to store write-data, the semiconductor memory including a plurality of memory cells, the plurality of memory cells being divided into a plurality of cell groups, and a plurality of cell peripheral circuits, each of the plurality of cell peripheral circuits being configured to write the write-data to a cell group among the plurality of cell groups which corresponds to a respective one of the plurality of cell peripheral circuits, the memory controller comprising:

a coding unit configured to encode a plurality of data symbols for generating a parity symbol, the plurality of data symbols being the write-data; and an interface configured to input the plurality of data symbols and the parity symbol to the semiconductor memory, the interface being configured to control the semiconductor memory to, using the plurality of cell peripheral circuits, write each of the plurality of data symbols to each of the plurality of cell groups.

8. The memory controller according to claim 7, wherein the plurality of data symbols are included in a page, the page being a data unit in which the write-data is read from the semiconductor memory, wherein a number of erroneous correctable data symbols in the each of the pages is equal to or greater than a number of data symbols in the each of the pages written to the cell group using the cell peripheral circuit that corresponds to the cell group among the plurality of cell peripheral circuits.

9. The memory controller according to claim 8, wherein the memory cells are configured as single bit storage cells.

10. The memory controller according to claim 7, wherein the plurality of data symbols are included in a plurality of pages, the page being a data unit in which the write-data is read from the semiconductor memory, wherein a number of erroneous correctable data symbols in the page is equal to or greater than a number of data symbols in the plurality of pages written to the cell group using the cell peripheral circuit that corresponds to the cell group among the plurality of cell peripheral circuits.

11. The memory controller according to claim 10, wherein the memory cells are configured as multi-value storage cells.

12. The memory controller according to claim 7, wherein the coding unit encodes the plurality of data symbols for generating a parity symbol by a Reed-Solomon coding.

13. A control method of a semiconductor memory, the semiconductor memory being configured to store write-data, the semiconductor memory including a plurality of memory cells, the plurality of memory cells being divided into a plurality of cell groups, and a plurality of cell peripheral circuits, each of the plurality of cell peripheral circuits being configured to write the write-data to a cell group among the plurality of cell groups which corresponds to a respective one of the plurality of cell peripheral circuits, the control method comprising:

encoding a plurality of data symbols for generating a parity symbol, the plurality of data symbols being the write-data; and writing each of the plurality of data symbols, using the plurality of cell peripheral circuits, to each of the plurality of cell groups.

14. The control method according to claim 13, wherein the plurality of data symbols are included in a page, the page being a data unit in which the write-data is read from the semiconductor memory, wherein a number of erroneous correctable data symbols in the page is equal to or greater than a number of data symbols in the each of the pages written to the cell group using the cell peripheral circuit that corresponds to the cell group among the plurality of cell peripheral circuits.

15. The control method according to claim 14, wherein the memory cells are configured as single bit storage cells.

16. The control method according to claim 13, wherein the plurality of data symbols are included in a plurality of pages, the page being a data unit in which the write-data is read from the semiconductor memory, wherein a number of erroneous correctable data symbols in the plurality of pages is equal to or greater than a number of data symbols in the plurality of pages written to the cell group using the cell peripheral circuit that corresponds to the cell group among the plurality of cell peripheral circuits.

17. The control method according to claim 16, wherein the memory cells are configured as multi-value storage cells.

18. The control method according to claim 13, wherein the encoding of the plurality of data symbols includes Reed-Solomon encoding.

* * * * *